(12) United States Patent
Jeong et al.

(10) Patent No.: US 7,800,280 B2
(45) Date of Patent: Sep. 21, 2010

(54) MEMS DEVICE AND FABRICATION METHOD OF THE SAME

(75) Inventors: Hee-moon Jeong, Yongin-si (KR); Jin-woo Cho, Seongnam-si (KR); Yong-hwa Park, Yongin-si (KR); Jun-o Kim, Yongin-si (KR); Seok-mo Chang, Bucheon-si (KR)

(73) Assignee: Samsung Electro-Mechanics Co., Ltd, Suwon-si (KR)

( * ) Notice: Subject to any disclaimer, the term of this patent is extended or adjusted under 35 U.S.C. 154(b) by 285 days.

(21) Appl. No.: 11/873,008

(22) Filed: Oct. 16, 2007

(65) Prior Publication Data

US 2008/0179988 A1 Jul. 31, 2008

(30) Foreign Application Priority Data

Jan. 25, 2007 (KR) .................... 10-2007-0007915

(51) Int. Cl.
*H02N 1/00* (2006.01)
(52) U.S. Cl. .................................... 310/309
(58) Field of Classification Search ............... 310/309; 359/196.1, 199.2, 199.3, 199.4, 200.6, 200.7, 359/200.8, 203.1, 213.1, 214.1, 223.1, 224.1
See application file for complete search history.

(56) References Cited

U.S. PATENT DOCUMENTS

| | | | | |
|---|---|---|---|---|
| 5,111,693 A | * | 5/1992 | Greiff | 73/514.35 |
| 6,122,089 A | * | 9/2000 | Minamoto et al. | 359/198.1 |
| 6,232,861 B1 | * | 5/2001 | Asada | 335/222 |
| 6,262,827 B1 | * | 7/2001 | Ueda et al. | 359/224.1 |
| 6,392,220 B1 | * | 5/2002 | Slater et al. | 250/216 |
| 6,404,313 B2 | | 6/2002 | Asada | |
| 6,487,908 B2 | * | 12/2002 | Geen et al. | 73/504.12 |
| 6,549,694 B2 | * | 4/2003 | Makino et al. | 385/18 |
| 6,617,098 B1 | | 9/2003 | Yu et al. | |
| 6,641,273 B1 | * | 11/2003 | Staker et al. | 359/876 |
| 6,844,952 B2 | * | 1/2005 | Dalziel | 359/224.1 |
| 2001/0053016 A1 | * | 12/2001 | Nelson | 359/291 |
| 2003/0142383 A1 | * | 7/2003 | Nanjyo et al. | 359/224 |
| 2004/0120058 A1 | * | 6/2004 | Kwon | 359/876 |

FOREIGN PATENT DOCUMENTS

| | | |
|---|---|---|
| EP | 1 582 879 A1 | 10/2005 |
| JP | 2001-13443 A | 1/2001 |
| JP | 2003-504221 A | 2/2003 |
| KR | 10-0415246 B1 | 1/2004 |
| WO | 96/39643 A | 12/1996 |

* cited by examiner

*Primary Examiner*—Burton Mullins
(74) *Attorney, Agent, or Firm*—Sughrue Mion, PLLC

(57) ABSTRACT

A microelectromechanical systems (MEMS) device includes a frame, an actuator formed on the same layer as the frame and connected to the frame to be capable of performing a relative motion with respect to the frame, and at least one stopper restricting a displacement of the actuator in a direction along the height of the actuator. The MEMS device is fabricated by bonding a second substrate to a first substrate, forming the frame and the actuator by partially removing the first substrate, and forming the at least one stopper by partially removing the second substrate.

10 Claims, 15 Drawing Sheets

MEMS DEVICE AND FABRICATION METHOD OF THE SAME

CROSS-REFERENCE TO RELATED PATENT APPLICATIONS

This application claims priority from Korean Patent Application No. 10-2007-0007915, filed on Jan. 25, 2007, in the Korean Intellectual Property Office, the disclosure of which is incorporated herein in its entirety by reference.

BACKGROUND OF THE INVENTION

1. Field of the Invention

Apparatuses and methods consistent with the present invention relate to a microelectromechanical systems (MEMS) device, and more particularly, to a MEMS device which can reduce damage due to an external shock by limiting the displacement of an actuator in a height direction, and a method of fabricating the MEMS device.

2. Description of the Related Art

Recently, a study on a MEMS device having a fine structure fabricated by micromachining technology has been actively performed in the technical fields of displays, laser printers, precision measurement, and precision processing. For example, in the display field, the MEMS device is highlighted for being used as an optical scanner to deflect and reflect scanning light to a screen.

A related art MEMS device mainly used as an optical scanner includes a frame and an actuator connected to the frame by a predetermined pivot axis to be capable of pivoting. The actuator is formed on the same layer with the frame and inside the frame. When an external shock in a direction along the plane is applied to the MEMS device, since the frame formed on the same layer with the actuator limits the excessive displacement of the actuator in the plane direction, damage to the MEMS device in spite of a relatively large external shock can be reduced. However, when an external shock is applied to the MEMS device in a height direction, since there is no part to limit the displacement of the actuator in the height direction, the MEMS device can be easily damaged permanently by a small external shock.

SUMMARY OF THE INVENTION

To address the above and/or other aspects, the present invention provides a microelectromechanical systems (MEMS) device which can reduce damage due to an external shock by limiting the displacement of an actuator in the height direction, and a method of fabricating the MEMS device.

According to an aspect of the present invention, a MEMS device comprises a frame, an actuator formed on a same layer as the frame and connected to the frame to be capable of performing a relative motion with respect to the frame; and at least one stopper which restricts a displacement of the actuator in a direction along a height of the actuator.

The stopper may comprise an ascending restriction stopper restricting an upward displacement of the actuator and a descending restriction stopper restricting a downward displacement of the actuator.

The ascending restriction stopper may be fixed to the frame and include an end portion that overlaps the actuator by being separated a predetermined distance from the actuator when there is no displacement of the actuator.

The descending restriction stopper may be fixed to the actuator and include an end portion that overlaps the frame by being separated a predetermined distance from the frame when there is no displacement of the actuator.

The MEMS device may further comprise a stage fixed to the actuator.

The stopper may be formed on the same layer as the stage.

The MEMS device may further comprise a separation column provided between the actuator and the stage to restrict deformation of the stage due to thermal deformation of the actuator.

A circular opening portion to restrict thermal transfer between the stage and the actuator may be formed in a peripheral area of an area where the actuator is coupled to the separation column.

The MEMS device may further comprise a light reflection surface formed on an upper surface of the stage.

The actuator may be connected to the frame to be capable of pivoting with respect to the frame.

The MEMS device may further comprise an electrostatic capacity sensor detecting an amount of pivot of the actuator.

The electrostatic capacity sensor may comprise a drive comb pivoting with the actuator according to the pivot of the actuator, and a fixed comb fixedly supported at a complementary position where the fixed comb is engaged with the drive comb and forming an overlapping surface whose area change according to the pivot of the drive comb.

The actuator may comprise an external variable portion connected to the frame to be capable of pivoting about a first pivot axis with respect to the frame, and an internal variable portion located inside the external variable portion to be capable of pivoting about a second axis with respect to the external variable portion based on a second pivot axis that is perpendicular to the first pivot axis, and the stopper may restrict a displacement of the external variable portion in the direction along the height of the actuator.

The MEMS device may further comprise a light reflection surface formed on an upper surface of the internal variable portion.

The MEMS device may further comprise a drive coil wound around a peripheral portion of the actuator, and at least one magnet forming a magnetic field that crosses current flowing in the drive coil.

According to another aspect of the present invention, a method of fabricating a MEMS device comprises bonding a second substrate to a first substrate, forming a frame and an actuator connected to the frame to be capable of performing a relative motion with respect to the frame by partially removing the first substrate, and forming at least one stopper restricting a displacement of the actuator in a direction along the height of the actuator by partially removing the second substrate.

The first and second substrates may be formed of silicon (Si).

The forming of an actuator may comprise forming the actuator connected to the frame to be capable of pivoting with respect to the frame.

The forming of at least one stopper may comprise forming an ascending restriction stopper restricting an upward displacement of the actuator and a descending restriction stopper restricting a downward displacement of the actuator.

The method may further comprise partially etching a lower surface of the second substrate before bonding the first substrate and the second substrate to allow an end portion of the at least one stopper to be separated from the first substrate.

The method may further comprise forming a stage fixed to the actuator by partially removing the second substrate.

The method may further comprise forming a light reflection surface on an upper surface of the stage.

The method may further comprise partially etching a lower surface of the second substrate before bonding the first and second substrates to form a separation column provided between the actuator and the stage.

The method may further comprise partially etching an upper surface of the first substrate before bonding the first and second substrates to allow an end portion of the stopper to be separated from the first substrate.

The forming of the actuator may comprise forming an external variable portion connected to the frame to be capable of pivoting about a first pivot axis with respect to the frame, and forming an internal variable portion located inside the external variable portion to be capable of pivoting about a second pivot axis with respect to the external variable portion, the second pivot axis being perpendicular to the first pivot axis.

The method may further comprise forming a light reflection surface on an upper surface of the internal variable portion.

The method may further comprise forming a drive coil wound around a peripheral portion of the actuator, and arranging a magnet to form a magnetic field that crosses current flowing in the drive coil.

The forming of the drive coil may comprise forming at least one drive coil groove by etching a lower surface of the first substrate, and depositing metal in the at least one drive coil groove.

BRIEF DESCRIPTION OF THE DRAWINGS

The above and other aspects of the present invention will become more apparent by describing in detail exemplary embodiments thereof with reference to the attached drawings in which:

FIGS. 4A and 4B are sectional views taken along line A-A' of FIG. 1, in which FIG. 4A illustrates that the actuator ascends by an external shock and FIG. 4B illustrates that the actuator descends by an external shock, according to an exemplary embodiment of the present invention;

DETAILED DESCRIPTION OF EXEMPLARY EMBODIMENTS

Figure 1:
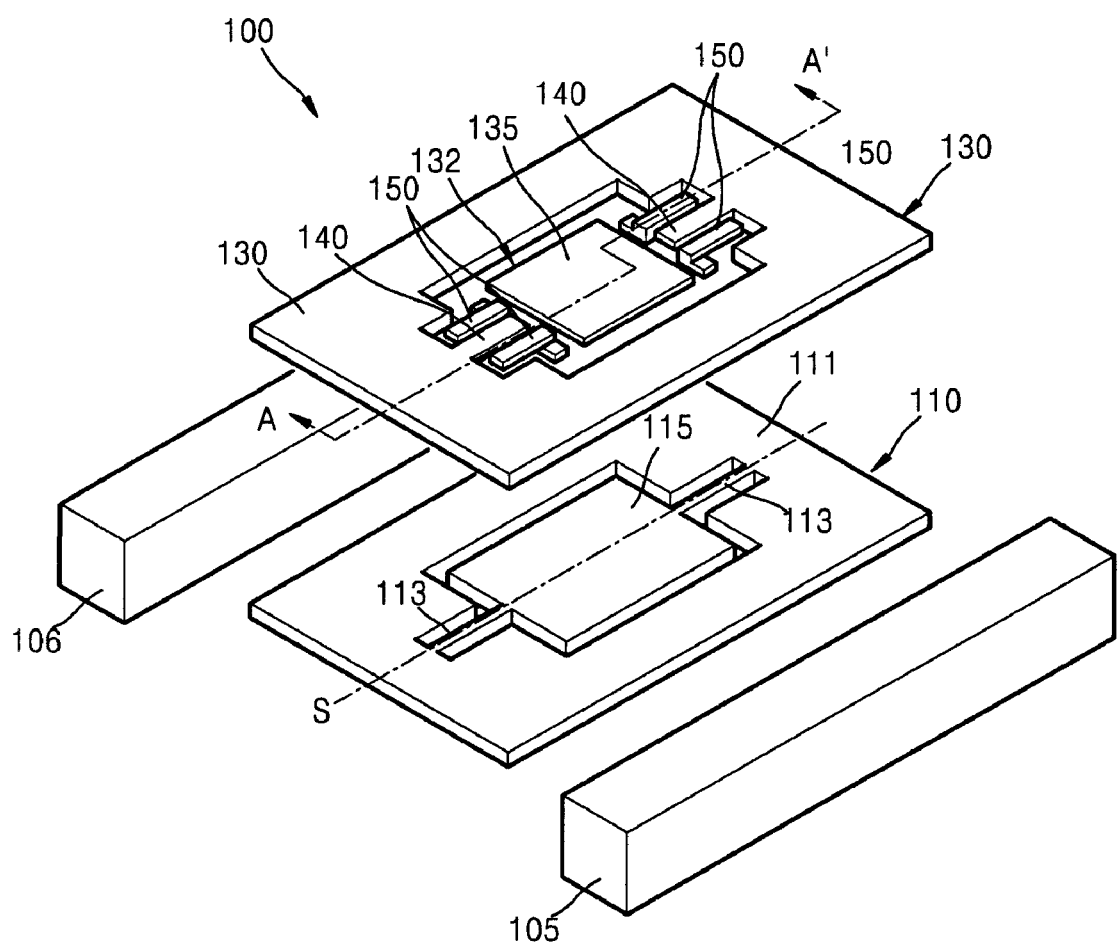
FIGS. 1 and 2 are exploded perspective views of a MEMS device according to an exemplary embodiment of the present invention, respectively viewed from the top and bottom sides.
Figure 2:
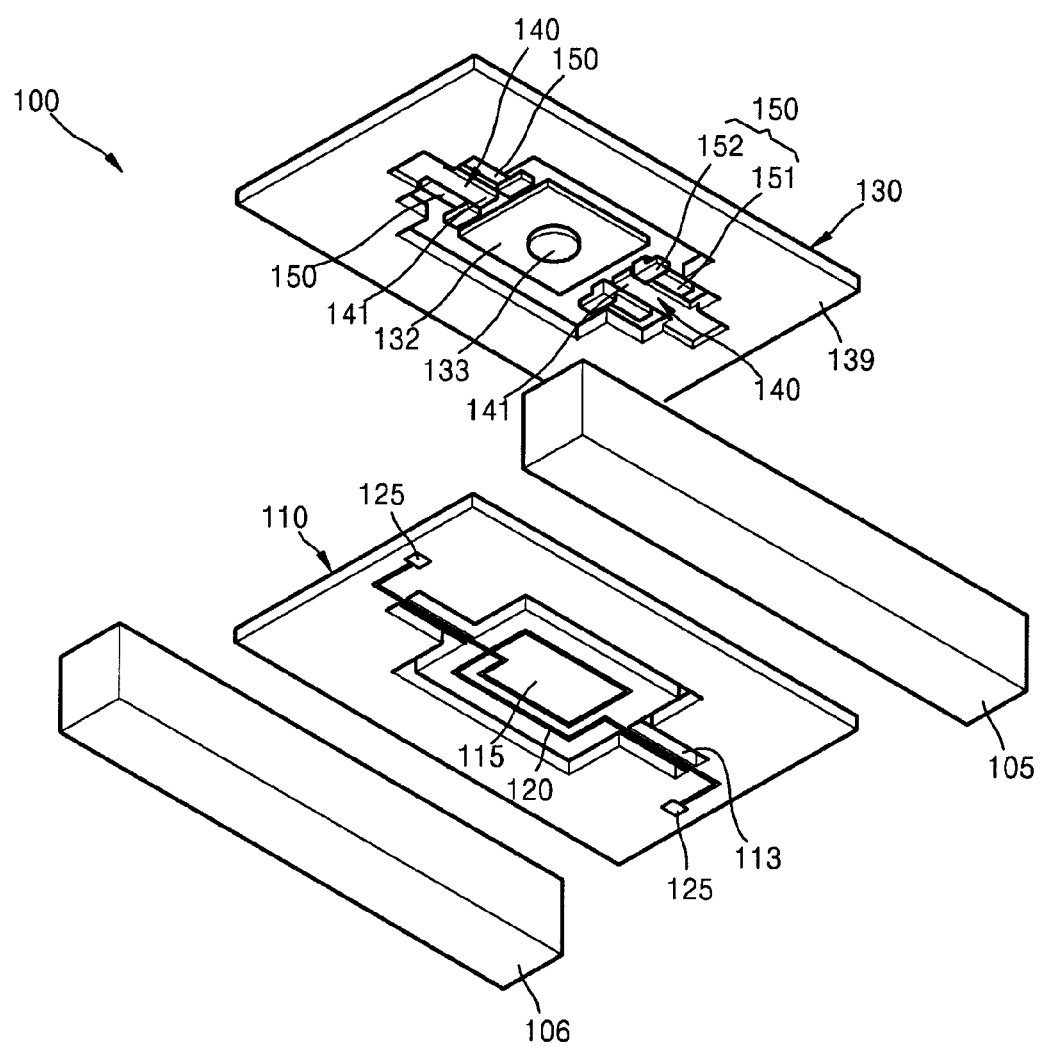
Figure 3:
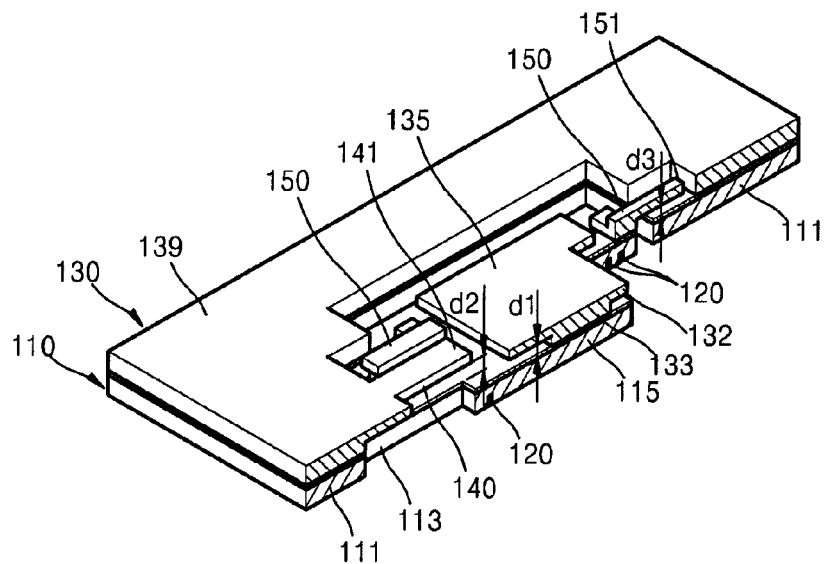
FIG. 3 is a partially cut-away view of the MEMS device taken along line A-A' of FIG. 1, according to an exemplary embodiment of the present invention.
Figure 4A:
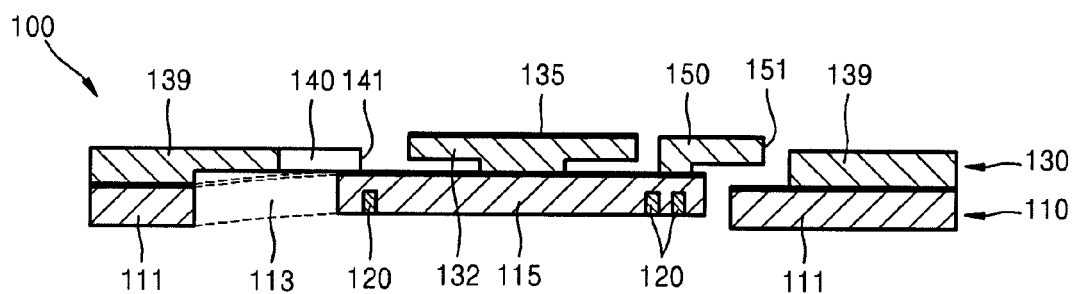
Figure 4B:
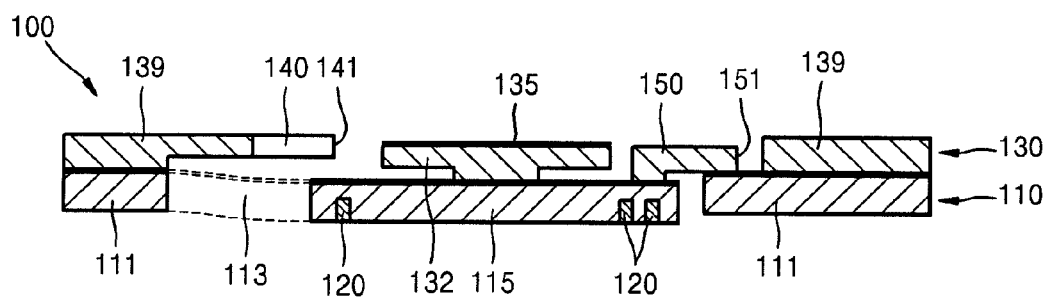

FIGS. 1 and 2 are exploded perspective views of a microelectromechanical systems (MEMS) device according to an exemplary embodiment of the present invention, respectively viewed from the top and bottom sides. FIG. 3 is a partially cut-away view of the MEMS device taken along line A-A' of FIG. 1. FIGS. 4A and 4B are sectional views taken along line A-A' of FIG. 1, in which FIG. 4A illustrates that the actuator ascends by an external shock and FIG. 4B illustrates that the actuator descends by an external shock.

Referring to FIGS. 1 through 3, a MEMS device 100 according to an exemplary embodiment of the present invention includes a frame 111 fixed to a predetermined support, an actuator 115 connected to the frame 111 to be capable of pivoting about a pivot axis S with respect to the frame 111, and a stage 132 fixed to the actuator 115. The actuator 115 is arranged at the center portion of the frame 111 and connected to the frame 111 by a pair of torsion springs 113. The frame 111, the actuator 115, and the torsion springs 113 are formed on the same layer because they are formed by processing a first substrate 110.

The MEMS device 100 includes a drive coil 120 wound around a peripheral portion of the bottom surface of the actuator 115. The MEMS device 100 further includes a pair of magnets 105 and 106 arranged at the opposite sides of the frame 111 to face each other to form a magnetic field that crosses current flowing in the drive coil 120. A terminal 125 is connected to external power to apply current to the drive coil 120. The actuator 115 pivots in a direction according to the Lorentz's Law by the interaction between the current flowing the drive coil 120 and a magnetic field formed in a direction crossing a pattern of the drive coil 120 by the magnets 105 and 106. When the current is discontinued, the actuator 115 returns to a state of being parallel to the frame 111 by an elastic restoration force of the torsion springs 113.

A light reflection surface 135 formed by depositing light reflection substances is provided on the upper surface of the stage 132. When the current flows in the drive coil 120, the drive coil 120 thermally expands by its own resistance so that the actuator 115 can be deformed. To restrict the deformation of the stage 132 due to the deformation of the actuator 115, a separation column 133 is provided between the stage 132 and the actuator 115. The stage 132 and the actuator 115 are separated as much as the height d1 of the separation column 133. To minimize the effect on the stage 132 by the thermal deformation of the actuator 115, the bottom surface of the separation column 133 adhering to the actuator 115 is set to be smaller than the light reflection surface 135 of the stage 132.

The MEMS device 100 includes a stopper restricting the displacement of the actuator 115 in the height direction. The stopper includes an ascending restriction stopper 140 restricting the upward displacement of the actuator 115 and a descending restriction stopper 150 restricting the downward displacement of the actuator 115. The stoppers 140 and 150 and the stage 132 are formed on the same layer because they are formed by processing a second substrate 130 adhering to the first substrate 110.

The ascending restriction stopper 140 extends from a fixing portion 139 adhering to the frame 111 and is fixed with respect to the frame 111. The ascending restriction stopper 140 includes an end portion 141 that overlaps the peripheral portion of the actuator 115 by being separated a predetermined distance d2 therefrom when there is no displacement of the actuator 115 in the height direction. The descending restriction stopper 150 is fixed with respect to the actuator 115 as an adhering surface 152 of the descending restriction stopper 150 adheres to the upper surface of the actuator 115. The descending restriction stopper 150 includes an end portion 151 that overlaps the frame 111 by being separated a predetermined distance d3 therefrom when there is no displacement of the actuator 115 in the height direction. The height d1 of the separation column 133, the separation distance d2 of the ascending restriction stopper 140, and the separation distance d3 of the descending restriction stopper 150 are formed by etching the lower surface of the second substrate 130 so that the d1, d2, and d3 can be identical to one another.

Referring to FIG. 4A, when an external shock is applied to the MEMS device 100 so that the actuator 115 ascends suddenly, since the peripheral portion of the actuator 115 is caught by the end portion 141 of the ascending restriction stopper 140, the excessive ascending of the actuator 115 is prevented. Referring to FIG. 4B, when an external shock is applied to the MEMS device 100 so that the actuator 115 descends suddenly, since the end portion 151 of the descending restriction stopper 150 descending with the actuator 115 is caught by the frame 111, the excessive descending of the actuator 115 is prevented. Accordingly, the damage of the MEMS device 100, in particular, the damage of the torsion springs 113, due to the external shock, is prevented.

Figure 5A:
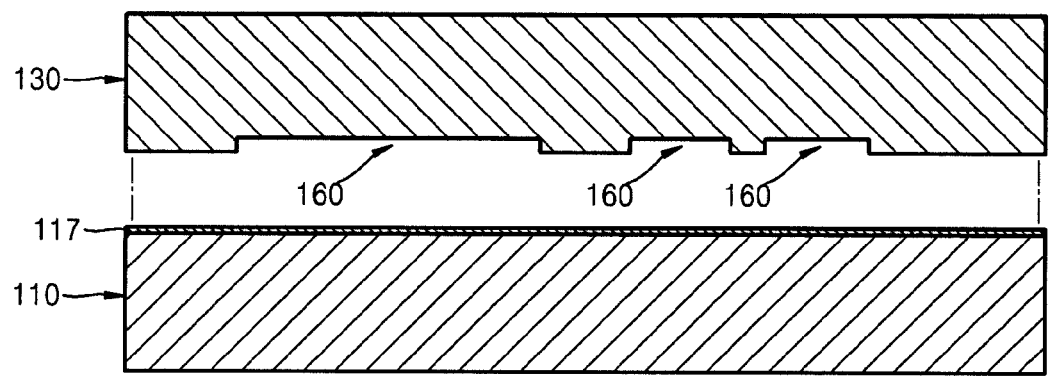
FIGS. 5A and 5F are sectional views sequentially illustrating the process of fabricating the MEMS device of FIG. 1, according to an exemplary embodiment of the present invention.
Figure 5B:
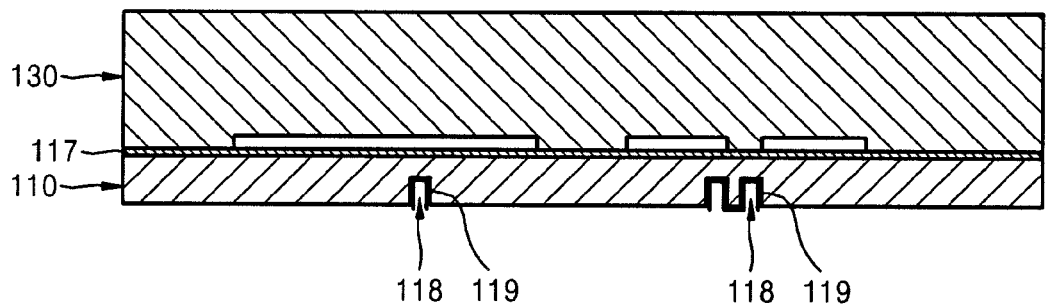
Figure 5C:
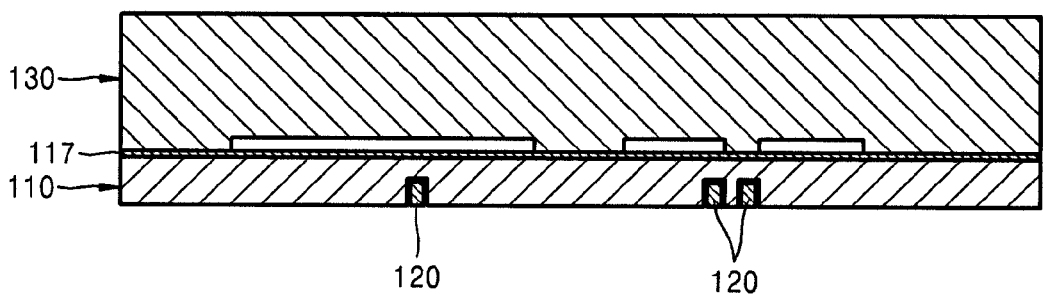
Figure 5D:
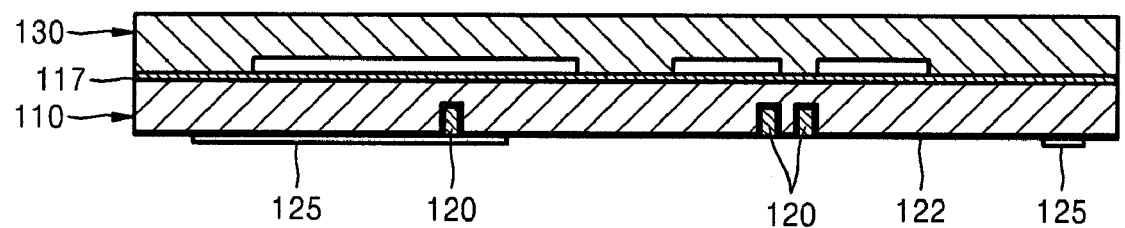
Figure 5E:
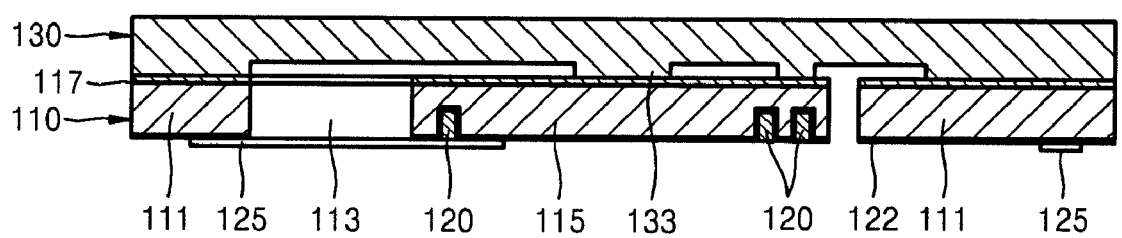
Figure 5F:
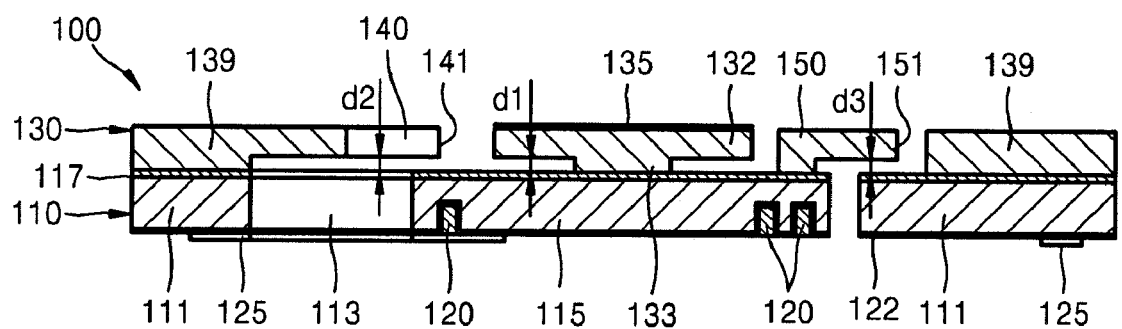

FIGS. 5A and 5F are sectional views sequentially illustrating the process of fabricating the MEMS device of FIG. 1. Referring to FIG. 5A, the first and second substrates 110 and 130 are prepared. The first and second substrates 110 and 130 may be formed of silicon (Si) exhibiting superior processing and evenness characteristics. The upper surface of the first substrate 110 is oxidized to form an insulation layer 117. The lower surface of the second substrate 130 is partially etched to form grooves 160 to form the distance d1 of the stage 132 of FIG. 3, the distance d2 of the ascending restriction stopper 140 of FIG. 3, and the distance d3 of the descending restriction stopper 150 of FIG. 3. The method of forming the grooves 160 includes sand blasting or dry or wet etching after forming a pattern by photolithography, which is well known in the semiconductor fabrication process.

Referring to FIG. 5B, the second substrate 130 is bonded to the first substrate 110. When the first and second substrates 110 and 130 are formed of silicon (Si), the first and second substrates 110 and 130 can be bonded in a silicon direct bonding (SDB) method. Next, the thickness of the first substrate 110 is grinded corresponding to the thickness of the actuator 115 of FIG. 3 and the frame 111 of FIG. 3, and a drive coil groove 118 is formed by etching the lower surface of the first substrate 110. The method of fabricating the drive coil groove 118 includes sand blasting or dry or wet etching after forming a pattern by photolithography, which is well known in the semiconductor fabrication process. Next, an insulation layer 119 is formed on the drive coil groove 118.

Referring to FIG. 5C, a drive coil 120 is formed by depositing metal, for example, copper (Cu) in the drive coil groove 118. The drive coil 120 can be formed by depositing metal or plating metal after depositing a metal seed layer (not shown) in the drive coil groove 118.

Referring to FIG. 5D, an insulation layer 122 is formed on the lower surface of the first substrate 110 where the drive coil 120 is formed and the terminal 125 for connecting the drive coil 120 to the external power is formed. The second substrate 130 is grinded corresponding to the thicknesses of the stage 132 of FIG. 3, the stoppers 140 and 150 of FIG. 3, and the fixing portion 139 of FIG. 3.

Referring to FIG. 5E, the first substrate 110 is partially removed so as to be penetrated in a direction of the thickness of the first substrate 110 to form the frame 111, the actuator 115, and the torsion springs 113. Referring to FIG. 5F, the second substrate 130 is partially removed so as to be penetrated in a direction of the thickness of the second substrate 130 to from the stage 132, the ascending restriction stopper 140, the descending restriction stopper 150, and the fixing portion 139.

Next, a metal light reflective substance is deposited on the upper surface of the stage 132 to form the light reflection surface 135. The magnets 105 and 106 of FIG. 1 are arranged to face each other with respect to the frame 111. The MEMS device 100 fabricated as above is used as an optical scanner.

Figure 6:
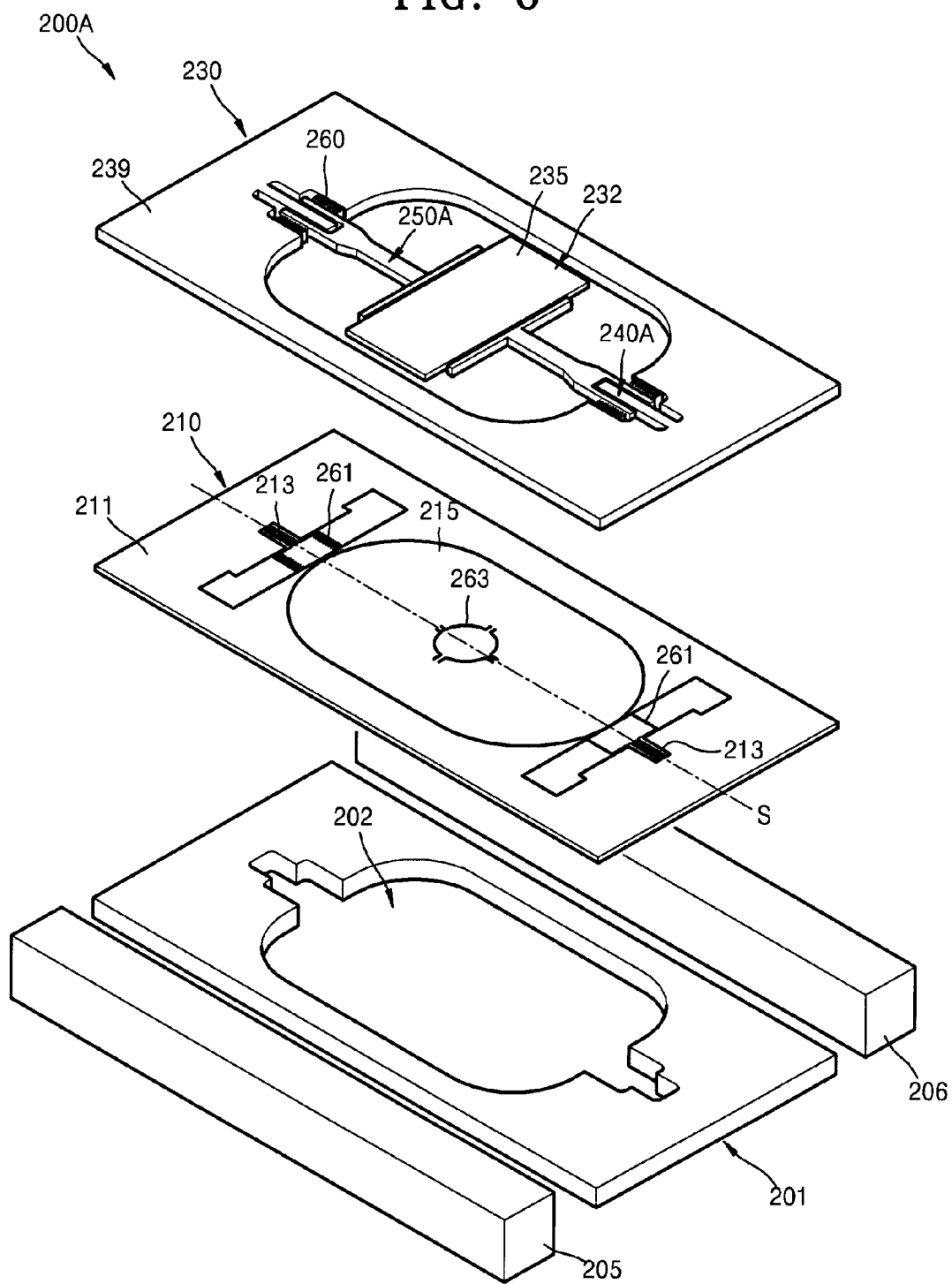
FIGS. 6 and 7 are exploded perspective views of a MEMS device according to another exemplary embodiment of the present invention, respectively viewed from the top and bottom sides.
Figure 7:
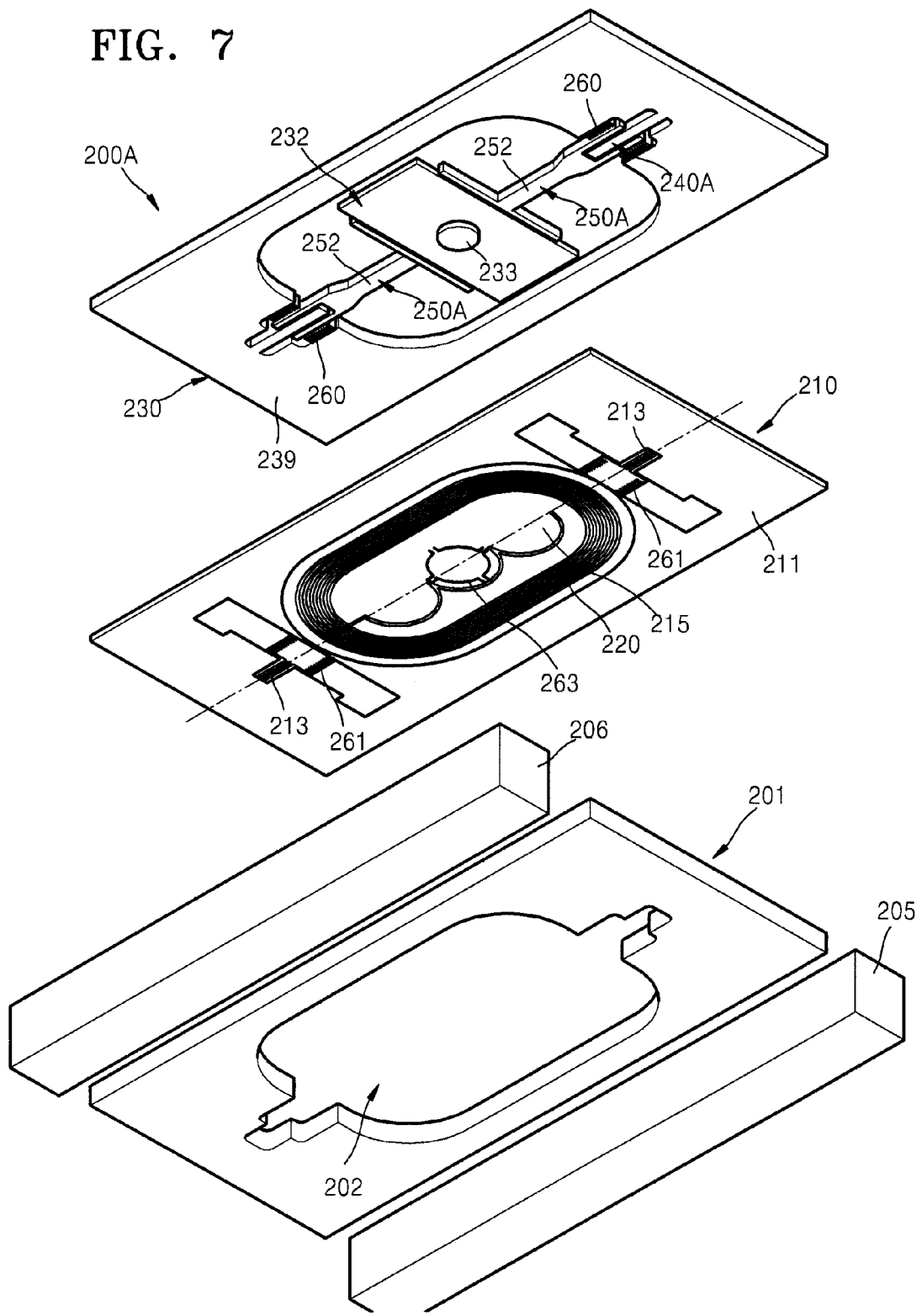
Figure 8:
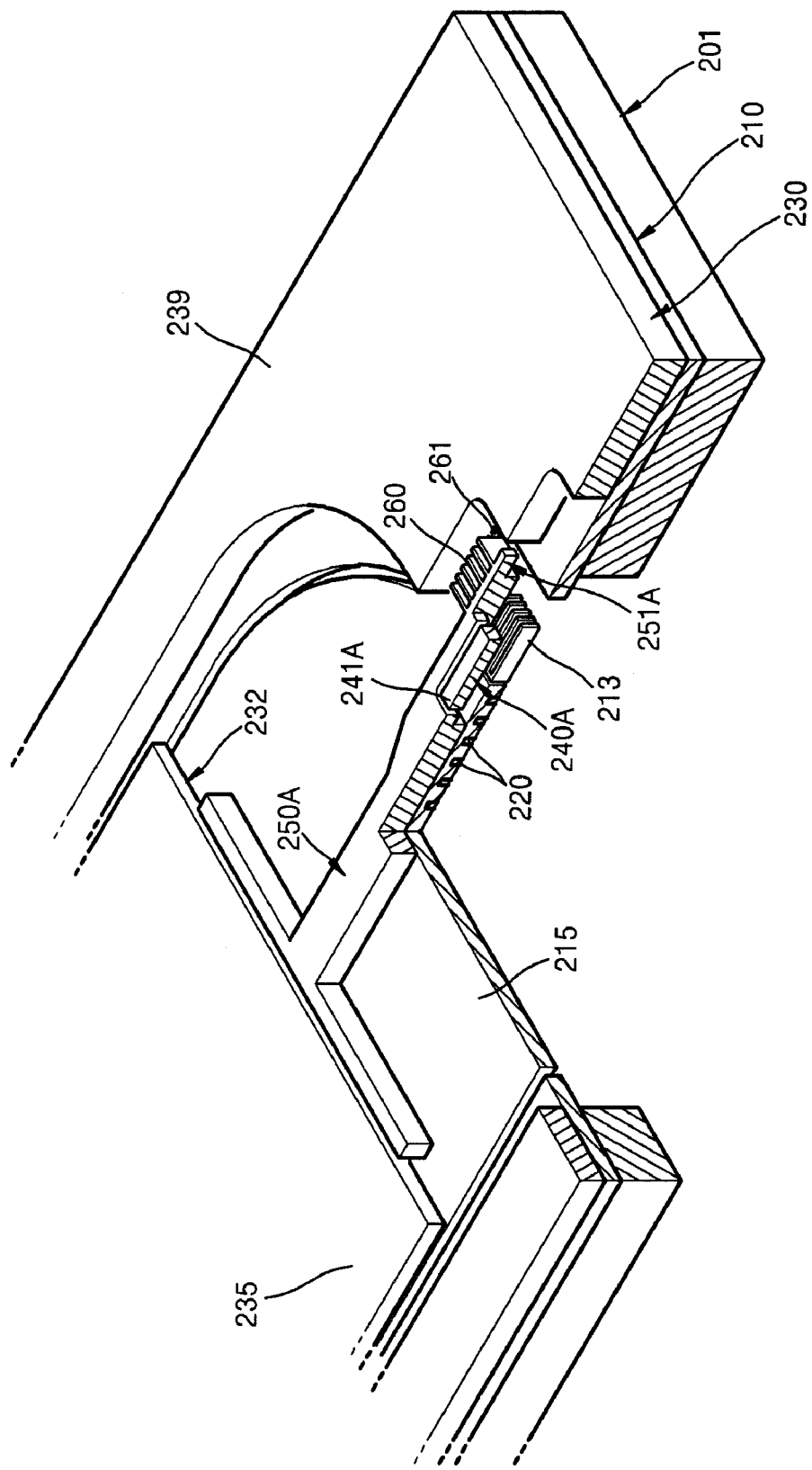
FIG. 8 is a partially cut-away view of the MEMS device of FIG. 6, according to an exemplary embodiment of the present invention.
Figure 9:
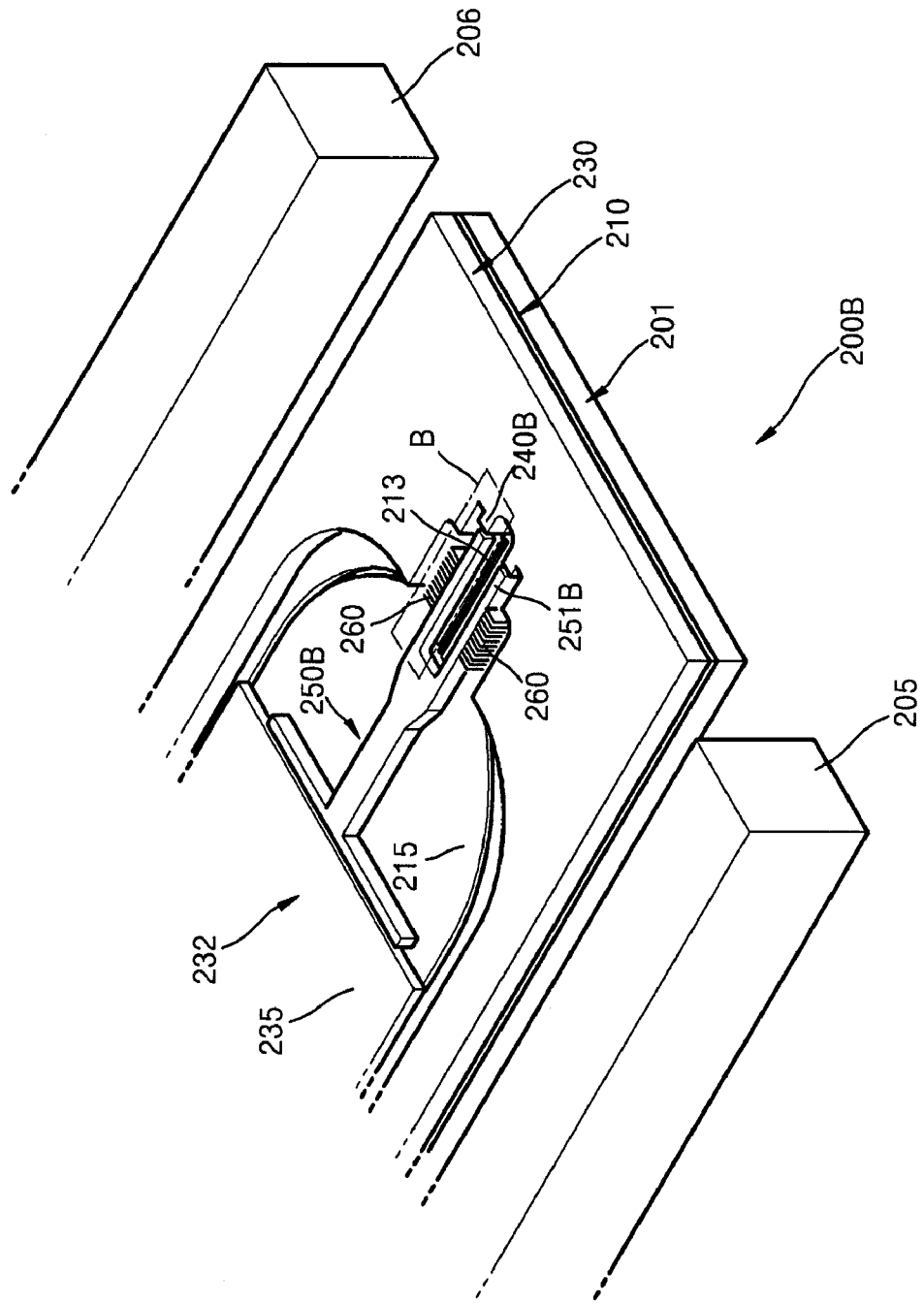
FIG. 9 is a perspective view of a MEMS device according to yet another exemplary embodiment of the present invention.
Figure 10:
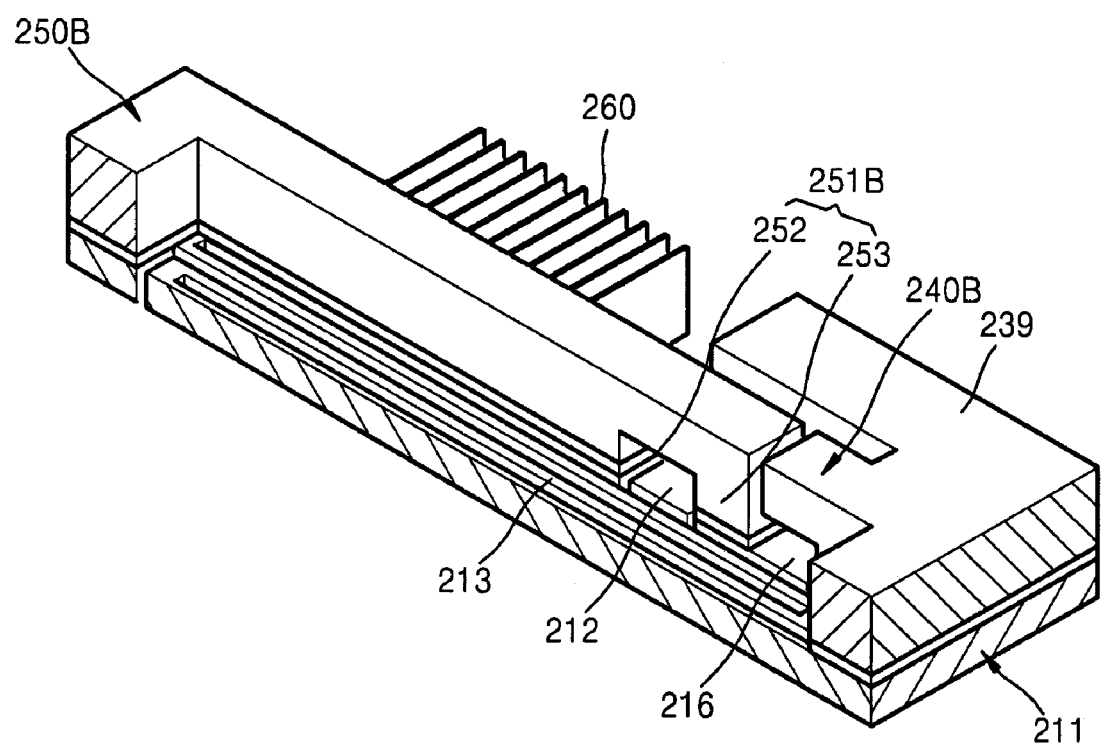
FIGS. 10 and 11 are enlarged perspective views of a portion B of FIG. 9, respectively viewed from the top and bottom sides, according to an exemplary embodiment of the present invention.
Figure 11:
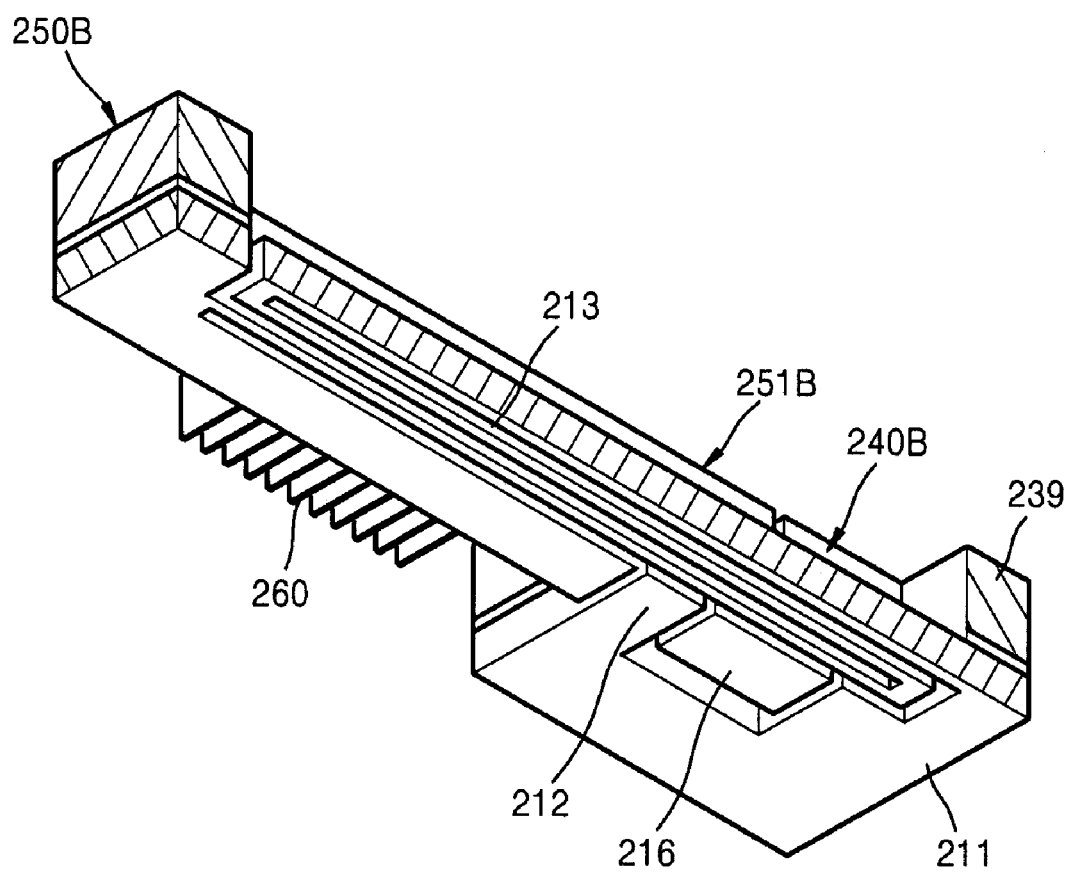

FIGS. 6 and 7 are exploded perspective views of a MEMS device according to another exemplary embodiment of the present invention, respectively viewed from the top and bottom sides. FIG. 8 is a partially cut-away view of the MEMS device of FIG. 6. FIG. 9 is a perspective view of a MEMS device according to yet another exemplary embodiment of the present invention. FIGS. 10 and 11 are enlarged perspective views of a portion B of FIG. 9, respectively viewed from the top and bottom sides.

Referring to FIGS. 6 through 8, a MEMS device 200A according to another exemplary embodiment of the present invention includes a frame 211 fixed to a base 201, an actuator 215 connected to the frame 211 to be capable of pivoting about a pivot axis S with respect to the frame 211, and a stage 232 fixed to the actuator 215. The actuator 215 is arranged at the center portion of the frame 211 and connected to the frame 211 via a pair of torsion springs 213. The frame 211, the actuator 215, and the torsion springs 213 are formed on the same layer because they are formed by processing a first substrate 210. The base 201 can be formed of silicon (Si) or glass, and an opening 202 is formed at the center portion of the base 201 not to prevent pivoting of the actuator 215.

A drive coil 220 is wound around a peripheral portion of the bottom surface of the actuator 215. A pair of magnets 205 and 206 are arranged at the opposite sides of the frame 211 to face each other. The actuator 215 pivots in a direction according to the Lorentz's Law by the interaction between current flowing the drive coil 220 and a magnetic field formed in a direction crossing a pattern of the drive coil 220 by the magnets 205 and 206. When the current is discontinued, the actuator 215 returns to a state of being parallel to the frame 211 by an elastic restoration force of the torsion springs 213.

A light reflection surface 235 is provided on the upper surface of the stage 232. A separation column 233 to restrict the deformation of the stage 232 due to the thermal deformation of the actuator 215 is provided between the stage 232 and the actuator 215. A circular opening 263 to restrict thermal transfer between the stage 232 and the actuator 215 is formed around an area where the separation column 233 is coupled to the actuator 215.

The MEMS device 200A includes an ascending restriction stopper 240A restricting the upward displacement of the actuator 215 and a descending restriction stopper 250A restricting the downward displacement of the actuator 215. The stoppers 240A and 250A and the stage 232 are formed on the same layer because they are formed by processing a second substrate 230 adhering to the first substrate 210.

The ascending restriction stopper 240A extends from a fixing portion 239 adhering to the frame 211, and is fixed with respect to the frame 211. The ascending restriction stopper 240A is separated a predetermined distance from the frame 211 and extends toward the peripheral portion of the actuator 215. The ascending restriction stopper 240A includes an end portion 241A that overlaps the peripheral portion of the actuator 215 by being separated a predetermined distance therefrom when there is no displacement of the actuator 215 in the height direction.

The descending restriction stopper 250A is fixed with respect to the actuator 215 as an adhering surface 252 of the descending restriction stopper 250A adheres to the upper surface of the actuator 215. The descending restriction stopper 250A includes an end portion 251A branched with respect to the ascending restriction stopper 240A and extending toward the frame 211. When there is no displacement of the actuator 215 in the height direction, the end portion 251A of the descending restriction stopper 250A overlaps the frame 211 by being separated a predetermined distance therefrom.

When an external shock is applied to the MEMS device 200A so that the actuator 215 ascends suddenly, since the peripheral portion of the actuator 215 is caught by the end portion 241A of the ascending restriction stopper 240A, the excessive ascending of the actuator 215 is prevented. Also, when an external shock is applied to the MEMS device 200A so that the actuator 215 descends suddenly, since the end portion 251A of the descending restriction stopper 250 descending with the actuator 215 is caught by the frame 211, the excessive descending of the actuator 215 is prevented. Accordingly, the damage of the MEMS device 200A, in particular, the damage of the torsion springs 213, due to the external shock, is prevented.

The MEMS device 200A further includes an electrostatic capacity sensor for detecting an amount of pivot of the actuator 215. The electrostatic capacity sensor includes a plurality of drive combs 260 extending from the descending restriction stopper 250A in a direction crossing the pivot axis S, and a plurality of fixed combs 261 fixed to the frame 211. The drive combs 260 pivot together with the actuator 215 and the stage 232 at the same angle as a pivot angle of the actuator 215 and the stage 232. The fixed combs 261 are fixedly supported at complementary positions so as to be engaged with the drive combs 260.

The fixed combs 261 and the drive combs 260 form an overlapping surface where they overlap each other. The area of the overlapping surface changes according to the pivot amount of the actuator 215. When a predetermined electric potential difference is given between the drive combs 260 and the fixed combs 261 where the overlapping surface is formed, an electrostatic capacity having a functional relationship with the pivot amount of the actuator 215 is formed. Thus, the pivot amount of the actuator 215 and the stage 232 can be measured by measuring the electrostatic capacity between the drive combs 260 and the fixed combs 261.

Referring to FIGS. 9 through 11, a MEMS device 200B according to yet another exemplary embodiment of the present invention, which is a modified example of the above-described MEMS device 200A, has the same structure as that of the MEMS device 200A except for the structures of an ascending restriction stopper 240B and a descending restriction stopper 250B. The descending restriction stopper 250B of the MEMS device 200B according to the present exemplary embodiment includes an end portion 251B branched not to cover the torsion springs 213 and extending toward the frame 211. The end portion 251B of the descending restriction stopper 250B includes a groove 252 cut upwardly and separated from a predetermined distance from an end portion 212 of the frame 211 when there is no displacement of the actuator 215 in the height direction, and a connection portion 253 provided at an end portion of the groove 252. An actuator piece 216 is bonded to the connection portion 253. Since the actuator piece 216 is separated from the frame 211, the actuator piece 216 moves according to the ascending/descending or pivoting of the actuator 215. The ascending restriction stopper 240B protrudes from the fixed portion 239 to face the connection portion 253 of the descending restriction stopper 250B. The ascending restriction stopper 240B is separated a predetermined distance from the actuator piece 216 when there is no displacement of the actuator 215 in the height direction.

When an external shock is applied to the MEMS device 200B so that the actuator 215 ascends suddenly, since the actuator piece 216 boned to the connection portion 253 is caught by the ascending restriction stopper 240B, the excessive ascending of the actuator 215 is prevented. Also, when an external shock is applied to the MEMS device 200B so that the actuator 215 descends suddenly, since the groove 252 of the descending restriction stopper 250B descending with the actuator 215 is caught by the end portion 212 of the frame 211 fixedly connected to the frame 211, the excessive descending of the actuator 215 is prevented. Accordingly, the damage of the MEMS device 200B, in particular, the damage of the torsion springs 213, due to the external shock, is prevented.

Figure 12:
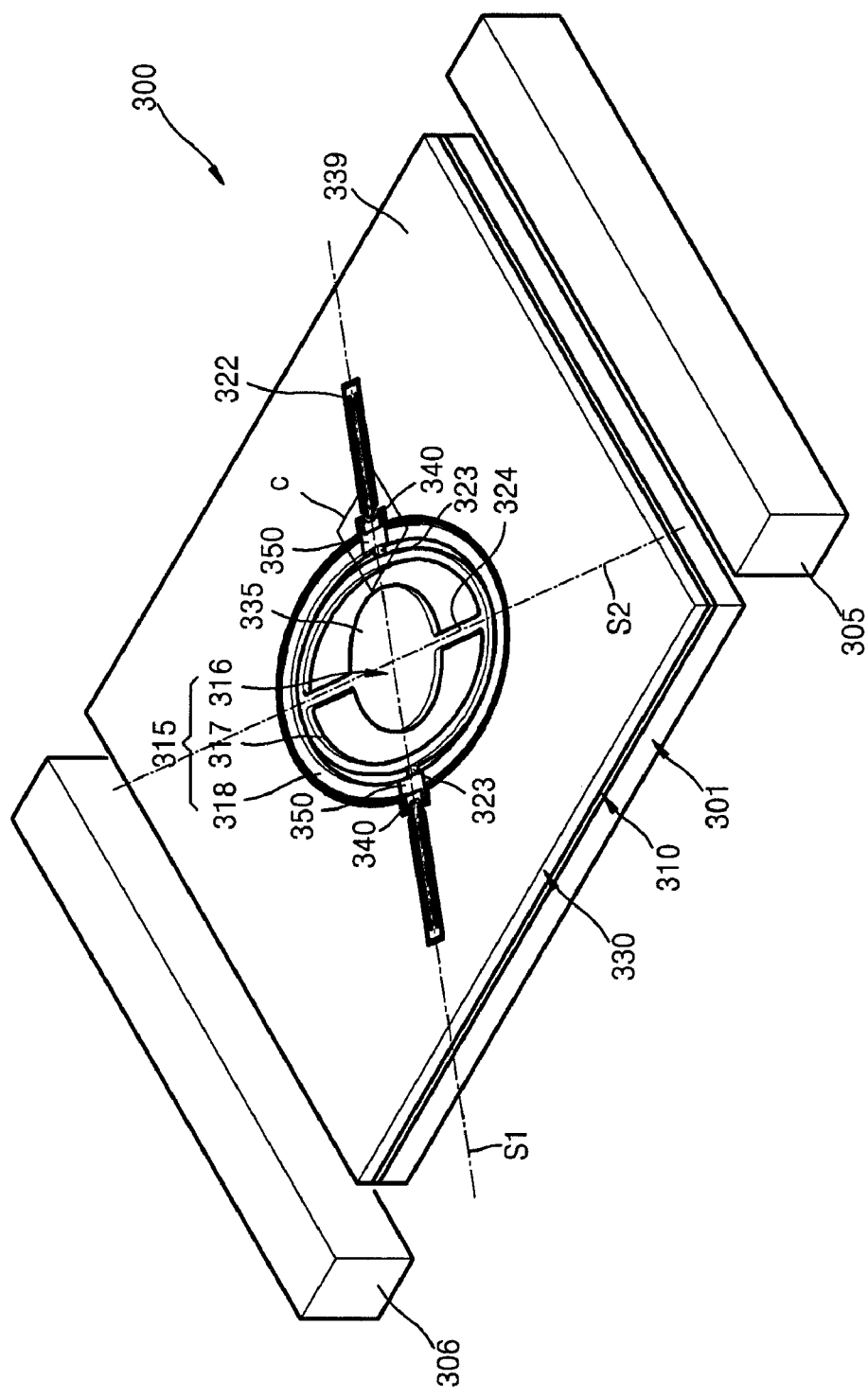
FIGS. 12 and 13 are perspective views of a MEMS device according to yet further another embodiment of the present invention, respectively viewed from the top and bottom sides, according to an exemplary embodiment of the present invention.
Figure 13:
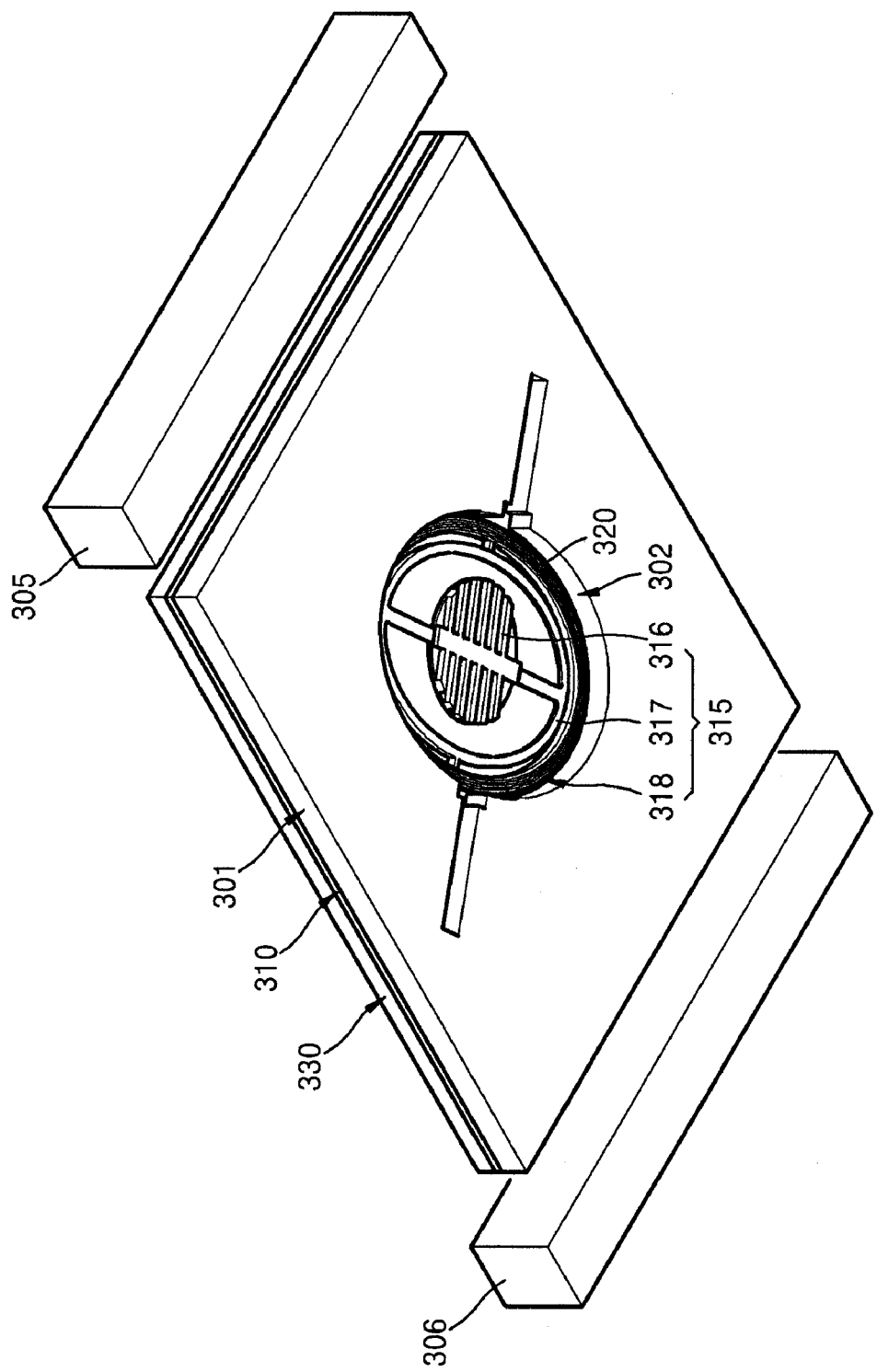
Figure 14:
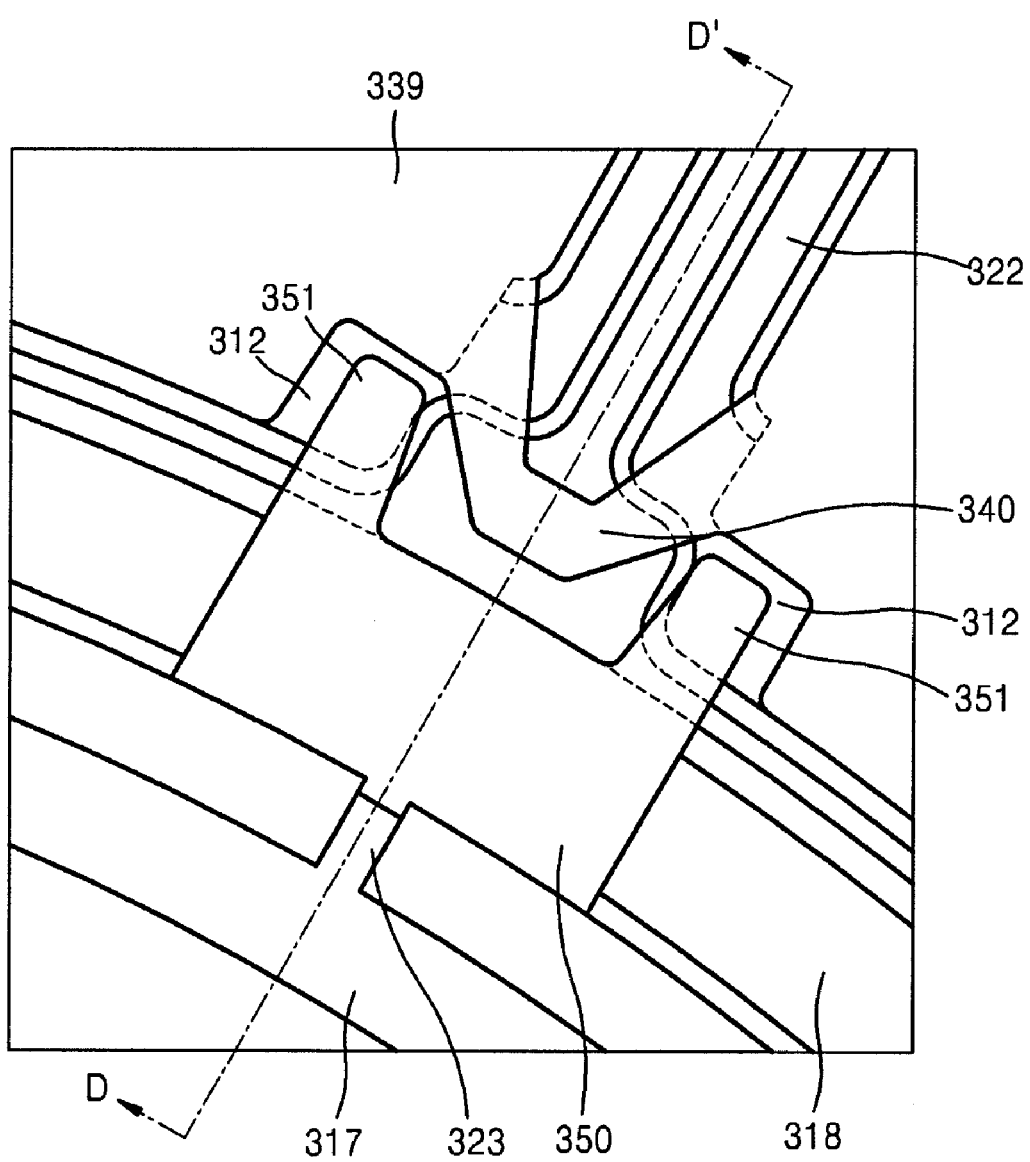
FIG. 14 is an enlarged plan view of a portion C of FIG. 12, according to an exemplary embodiment of the present invention.
Figure 15:
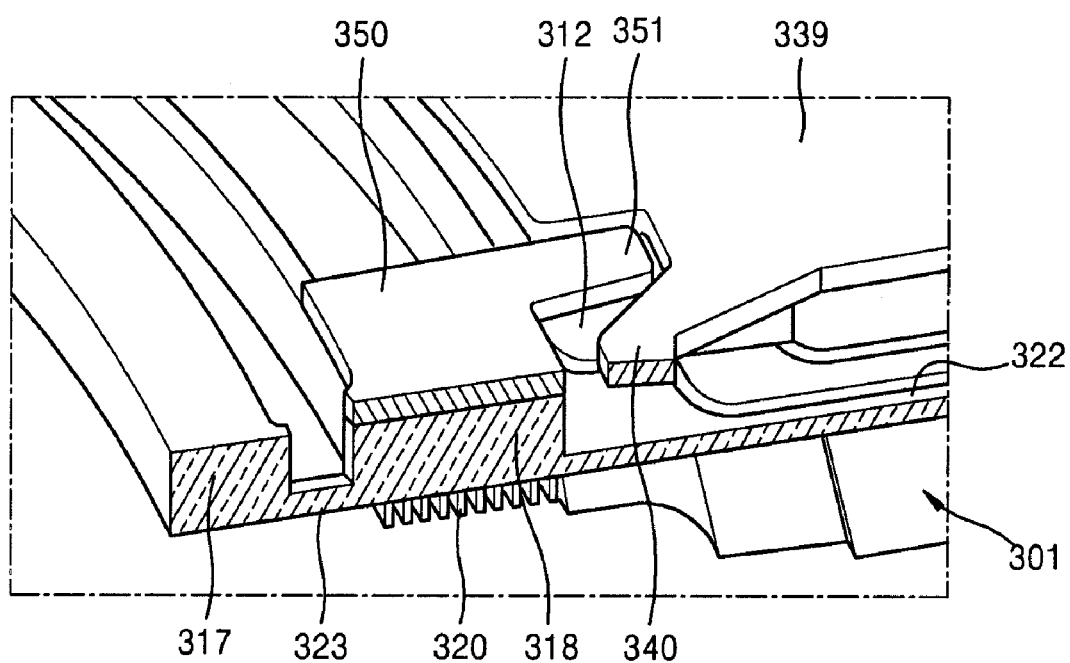
FIG. 15 is a partially cut-away perspective view taken along line D-D' of FIG. 14, according to an exemplary embodiment of the present invention.

FIGS. 12 and 13 are perspective views of a MEMS device according to yet further another exemplary embodiment of the present invention, respectively viewed from the top and bottom sides. FIG. 14 is an enlarged plan view of a portion C of FIG. 12. FIG. 15 is a partially cut-away perspective view taken along line D-D' of FIG. 14.

Referring to FIGS. 12 through 15, a MEMS device 300 according to yet further another exemplary embodiment of the present invention includes a base 301 having an opening 302 at the center portion thereof, a first substrate 310 adhering to the base 301 and a second substrate 330 adhering to the first substrate 310. The base 301 can be formed of silicon (Si) or glass while the first and second substrates 310 and 330 can be formed of silicon.

The first substrate 310 includes an actuator 315 arranged in an opening 302 of the base 301 to be capable of pivoting, and a frame (not shown) bonded and fixed to the base 301. The second substrate 330 includes a fixed portion 339 bonded and fixed to the frame of the first substrate 310 and an ascending restriction stopper 340 and a descending restriction stopper 350 restricting the displacement of the actuator 315 in the height direction.

The actuator 315 includes an external variable portion 318 connected to the frame to be capable of pivoting about a first pivot axis S1 with respect to the frame, an internal variable portion 316 capable of pivoting with respect to the external variable portion 318 based on a second pivot axis S2 crossing the first pivot axis S1, and a filter variable 317 provided between the internal variable portion 316 and the external variable portion 318. The external variable portion 318 is connected to the frame of the first substrate 310 by a pair of first torsion springs 322 extending in the same direction as the first pivot axis S1. The filter variable portion 317 is connected to the external variable portion 318 by a pair of filter springs 323 extending in the same direction as the first torsion springs 322. The internal variable portion 316 is connected to the filter variable portion 317 by a pair of second torsion springs 324 extending in the same direction as the second pivot axis S2.

A drive coil 320 is formed around a lower surface of the external variable portion 318. A pair of magnets 305 and 306 are arranged to face each other with respect to the base 301, the first substrate 310, and the second substrate 330. The direction of magnetic field lines formed by the magnets 305 and 306 is inclined with respect to the first pivot axis S1 and the second pivot axis S2. When current is applied to the drive coil 320, torque is generated in a direction perpendicular to the direction of the current and a magnetic field formed by the magnets 305 and 306. The torque is separated into two components of the first pivot axis S1 and the second pivot axis S2 so that the internal variable portion 316 pivots about the second pivot axis S2. Also, the internal variable portion 316, the filter variable portion 317, and the external variable portion 318 pivot about the first pivot axis S1. A light reflection surface 335 is formed on the upper surface of the internal variable portion 316 so that an optical signal incident on the light reflection surface 335 can be divided into two axes.

The filter variable portion 317 and the filter springs 323 separate the external variable portion 318 that pivots at a low frequency, and the internal variable portion 316 that pivots at a high frequency so that unnecessary vibrations of the external variable portion 318 due to high frequency noise is blocked. That is, the filter variable portion 317 and the filter springs 323 are mechanical configuration of a low pass filter.

The ascending restriction stopper 340 and the descending restriction stopper 350 are configured to restrict the displacement of the external variable portion 318 in the height direction. In detail, the ascending restriction stopper 340 is integrally formed with the fixed portion 339 of the second substrate 330 to overlap the peripheral portion of the external variable portion 318 by being separated a predetermined distance therefrom when there is no displacement of the external variable portion 318 in the height direction. The descending restriction stopper 350 is bonded to the upper surface of the external variable portion 318 and fixed to the external variable portion 318. The descending restriction stopper 350 has an end portion 351 that overlaps a frame peripheral portion 312 outside the external variable portion 318 by being separated a predetermined distance therefrom when there is no displacement of the external variable portion 318 in the height direction.

When an external shock is applied to the MEMS device 300 so that the external variable portion 318 ascends suddenly, since the peripheral portion of the external variable portion 318 is caught by the ascending restriction stopper 340, the excessive ascending of the external variable portion 318 is prevented. Also, when an external shock is applied to the MEMS device 300 so that the external variable portion 318 descends suddenly, since the end portion 351 of the descending restriction stopper 350 descending with the external variable portion 318 is caught by the frame peripheral portion 312, the excessive descending of the external variable portion 318 is prevented. The internal variable portion 316 hardly ascends or descends with respect to the external variable portion 318 and the filter variable portion 317 because the rigidity of the second torsion springs 324 supporting the internal variable portion 316 is great. Accordingly, the damage of the MEMS device 300, in particular, the damage of the first torsion springs 322, due to the external shock, is prevented.

The fabrication process of the MEMS device 300 is similar to that of the MEMS device 100 according to the above first exemplary embodiment. However, for the ascending restriction stopper 340 and the descending restriction stopper 350 to be separated a predetermined distance from the peripheral portion of the external variable portion 318 and the frame peripheral portion 312, respectively, before the first substrate 310 and the second substrate 330 are bonded together, a groove is formed by etching the upper surface of the first substrate 310 using a predetermined pattern not etching the lower surface of the second substrate 330. By etching the upper surface of the first substrate 310, the thicknesses of the first torsion springs 322 and the filter springs 323 are made thinner than the thickness of the second torsion springs 324 so that the rigidity of the first torsion spring 322 and the filter springs 323 can be made less than that of the second torsion springs 324.

As described above, the MEMS device according to the exemplary embodiments the present invention includes the stoppers restricting the displacement of the actuator in the height direction so that the damage of the MEMS device due to an external shock, and an increase of costs accompanying the damage can be prevented.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A microelectromechanical systems (MEMS) device comprising:
    a frame;
    an actuator formed on a same layer as the frame and connected to the frame to be capable of performing a relative motion with respect to the frame; and
    at least one stopper which restricts a displacement of the actuator in a direction along a height of the actuator,
    wherein the at least one stopper comprises an ascending restriction stopper which restricts an upward displacement of the actuator and a descending restriction stopper which restricts a downward displacement of the actuator,
    wherein the ascending restriction stopper is fixed to the frame, and includes an end portion that overlaps the actuator by being separated by a predetermined distance from the actuator when there is no displacement of the actuator, and the actuator has a peripheral portion, the peripheral portion of the actuator being caught by the end portion of the ascending restriction stopper in a case of an external shock, and
    wherein the descending restriction stopper is fixed to the actuator, and includes an end portion that overlaps the frame by being separated by a predetermined distance from the frame when there is no displacement of the actuator, and the end portion of the descending restriction stopper descending with the actuator is caught by the frame in a case of an external shock.

2. The MEMS device of claim 1, further comprising a stage fixed to the actuator.

3. The MEMS device of claim 2, wherein the at least one stopper is formed on a same layer as the stage.

4. The MEMS device of claim 2, further comprising a separation column provided between the actuator and the stage to restrict deformation of the stage due to thermal deformation of the actuator.

5. The MEMS device of claim 4, wherein a circular opening portion to restrict thermal transfer between the stage and the actuator is formed in a peripheral area of an area where the actuator is coupled to the separation column.

6. The MEMS device of claim 1, wherein the actuator is connected to the frame to be capable of pivoting with respect to the frame.

7. The MEMS device of claim 6, further comprising an electrostatic capacity sensor which detects an amount of pivot of the actuator.

8. The MEMS device of claim 7, wherein the electrostatic capacity sensor comprises:
- a drive comb which pivots with the actuator according to the pivoting of the actuator; and
- a fixed comb which is fixedly supported at a complementary position where the fixed comb is engaged with the drive comb, and forms an overlapping surface whose area changes according to the pivoting of the drive comb.

9. The MEMS device of claim 1, wherein the actuator comprises:
- an external variable portion connected to the frame to be capable of pivoting about a first pivot axis with respect to the frame; and
- an internal variable portion located inside the external variable portion to be capable of pivoting about a second pivot axis with respect to the external variable portion, the second pivot axis being perpendicular to the first pivot axis,
- wherein the stopper restricts a displacement of the external variable portion in the direction along the height of the actuator.

10. The MEMS device of claim 1, further comprising:
- a drive coil wound around a peripheral portion of the actuator; and
- at least one magnet which forms a magnetic field that crosses current flowing in the drive coil.

* * * * *